United States Patent
Kurashina et al.

(10) Patent No.: US 9,801,317 B2
(45) Date of Patent: Oct. 24, 2017

(54) PRODUCTION MANAGEMENT SYSTEM FOR COMPONENT MOUNTING MACHINE

(71) Applicant: FUJI MACHINE MFG. CO., LTD., Chiryu (JP)

(72) Inventors: Takashi Kurashina, Okazaki (JP); Hiroaki Muratsuchi, Hashima-gun (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 207 days.

(21) Appl. No.: 14/773,841

(22) PCT Filed: Mar. 14, 2013

(86) PCT No.: PCT/JP2013/057149
§ 371 (c)(1),
(2) Date: Sep. 9, 2015

(87) PCT Pub. No.: WO2014/141422
PCT Pub. Date: Sep. 18, 2014

(65) Prior Publication Data
US 2016/0037693 A1    Feb. 4, 2016

(51) Int. Cl.
*B23P 19/00*    (2006.01)
*H05K 13/02*    (2006.01)
(Continued)

(52) U.S. Cl.
CPC .......... *H05K 13/02* (2013.01); *H05K 13/0495* (2013.01); *H05K 13/08* (2013.01); *Y10T 29/53174* (2015.01)

(58) Field of Classification Search
CPC .... H05K 13/0408; H05K 13/02; H05K 13/04; Y10T 29/4913; Y10T 29/53174; Y10T 29/53
(Continued)

(56) References Cited

U.S. PATENT DOCUMENTS 6,996,440 B2 *  2/2006  Maenishi ........... H05K 13/0452
                                                    29/740
7,200,922 B2 *  4/2007  Kabeshita .......... H05K 13/0061
                                                    29/740
(Continued)

FOREIGN PATENT DOCUMENTS

CN    1430867 A    7/2003
EP    1 296 548 A2    3/2003
(Continued)

OTHER PUBLICATIONS

International Search Report dated May 14, 2013 in PCT/JP2013/057149 filed Mar. 14, 2013.
(Continued)

*Primary Examiner* — Thiem Phan
(74) *Attorney, Agent, or Firm* — Oblon, McClelland, Maier & Neustadt, L.L.P.

(57) ABSTRACT

A production management system is configured so as to make it possible to produce component mounting boards to the same specifications in two lanes of a component mounting machine using one set of NC data by arranging feeders of two feeder set bases in the same manner and setting the mounting order of the components to the circuit boards in the two lanes to be the same in a same-direction production mode in which circuit boards are conveyed in the same front/back direction in the two lanes. In addition, the arrangement of the feeders and the mounting order of the components are optimized so that the difference in production times in the two lanes in the same-direction production mode is minimized.

4 Claims, 5 Drawing Sheets

(51) Int. Cl.
*H05K 13/08* (2006.01)
*H05K 13/04* (2006.01)

(58) Field of Classification Search
USPC .................. 29/739, 740, 743, 830, 831, 832
See application file for complete search history.

(56) References Cited

U.S. PATENT DOCUMENTS

| | | |
|---|---|---|
| 2003/0058608 A1 | 3/2003 | Ohuchi et al. |
| 2004/0033128 A1 | 2/2004 | Kabeshita et al. |
| 2006/0000085 A1 | 1/2006 | Kabeshita et al. |
| 2010/0249971 A1 | 9/2010 | Maenishi et al. |
| 2010/0325860 A1 | 12/2010 | Maenishi |

FOREIGN PATENT DOCUMENTS

| | | |
|---|---|---|
| EP | 1 330 151 A1 | 7/2003 |
| JP | 2009 218572 | 9/2009 |
| JP | 2009 231808 | 10/2009 |
| JP | 2011 134919 | 7/2011 |
| JP | 2012 99654 | 5/2012 |
| JP | 2012 128532 | 7/2012 |

OTHER PUBLICATIONS

Extended European Search Report dated Mar. 9, 2016 in Patent Application No. 13878035.8.
Chinese Office Action issued in Chinese Patent Application No. 201380074553.5 on May 2, 2017 (English translation).

\* cited by examiner

[Fig.1]
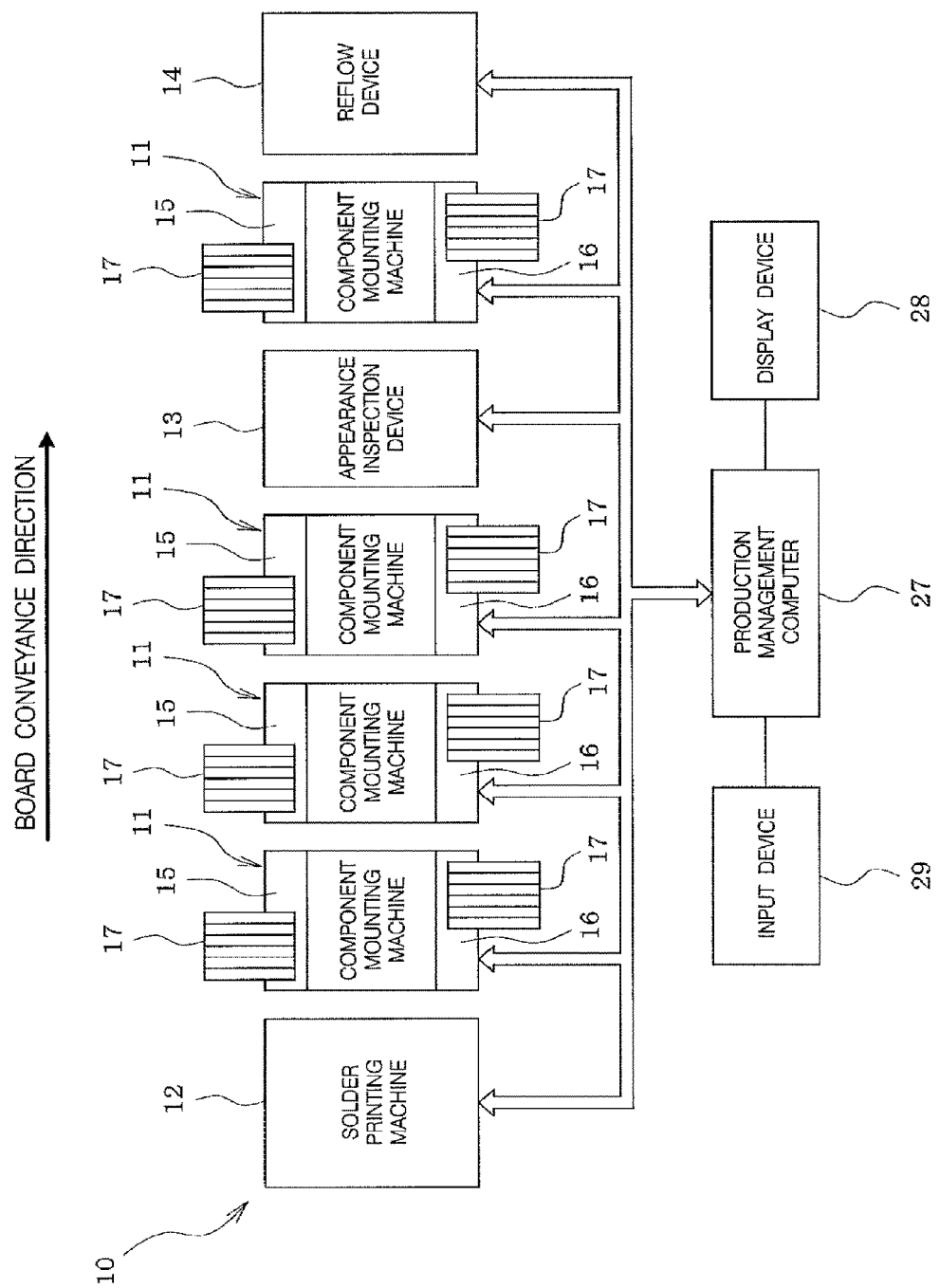

[Fig.2]
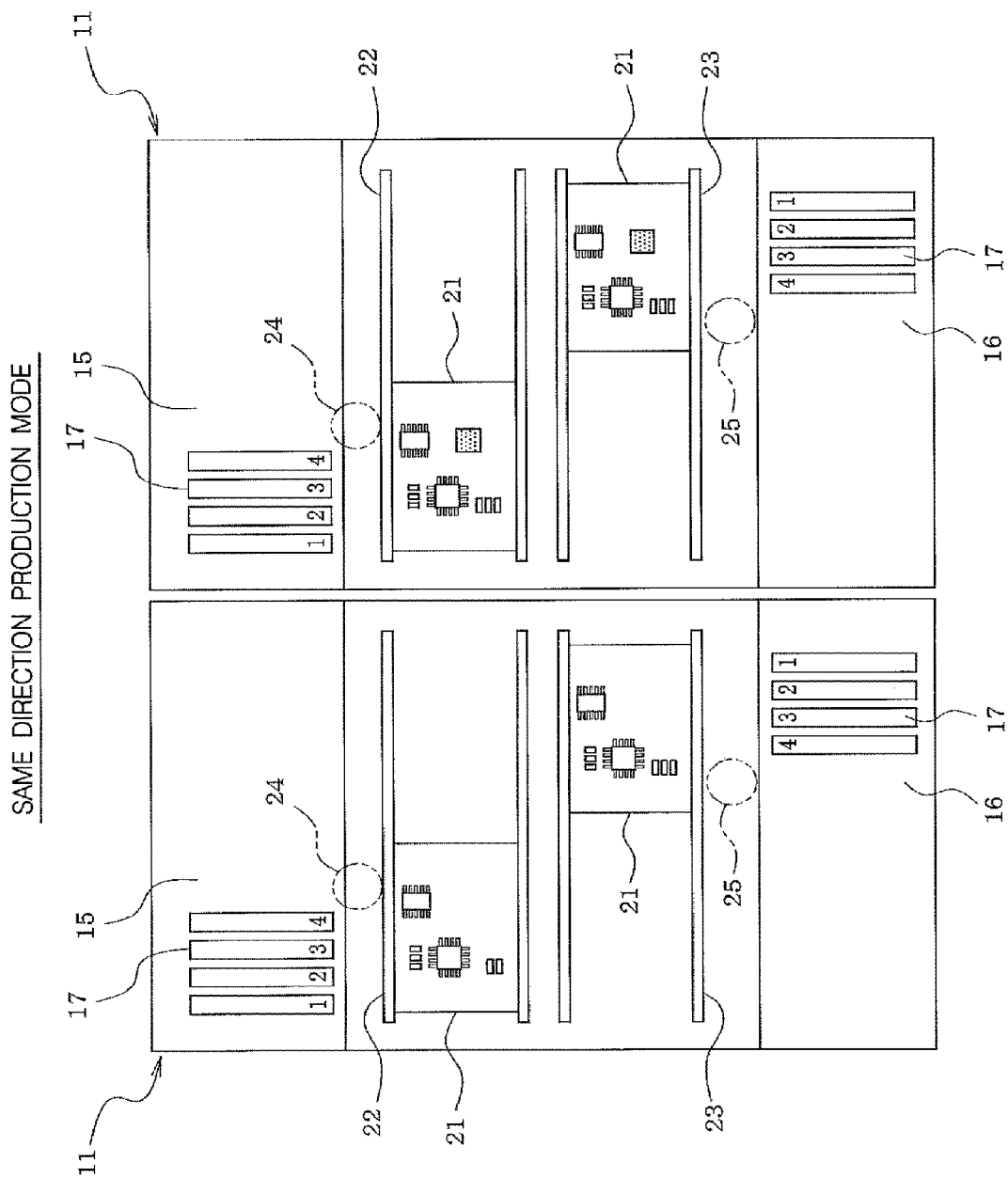

[Fig.3]
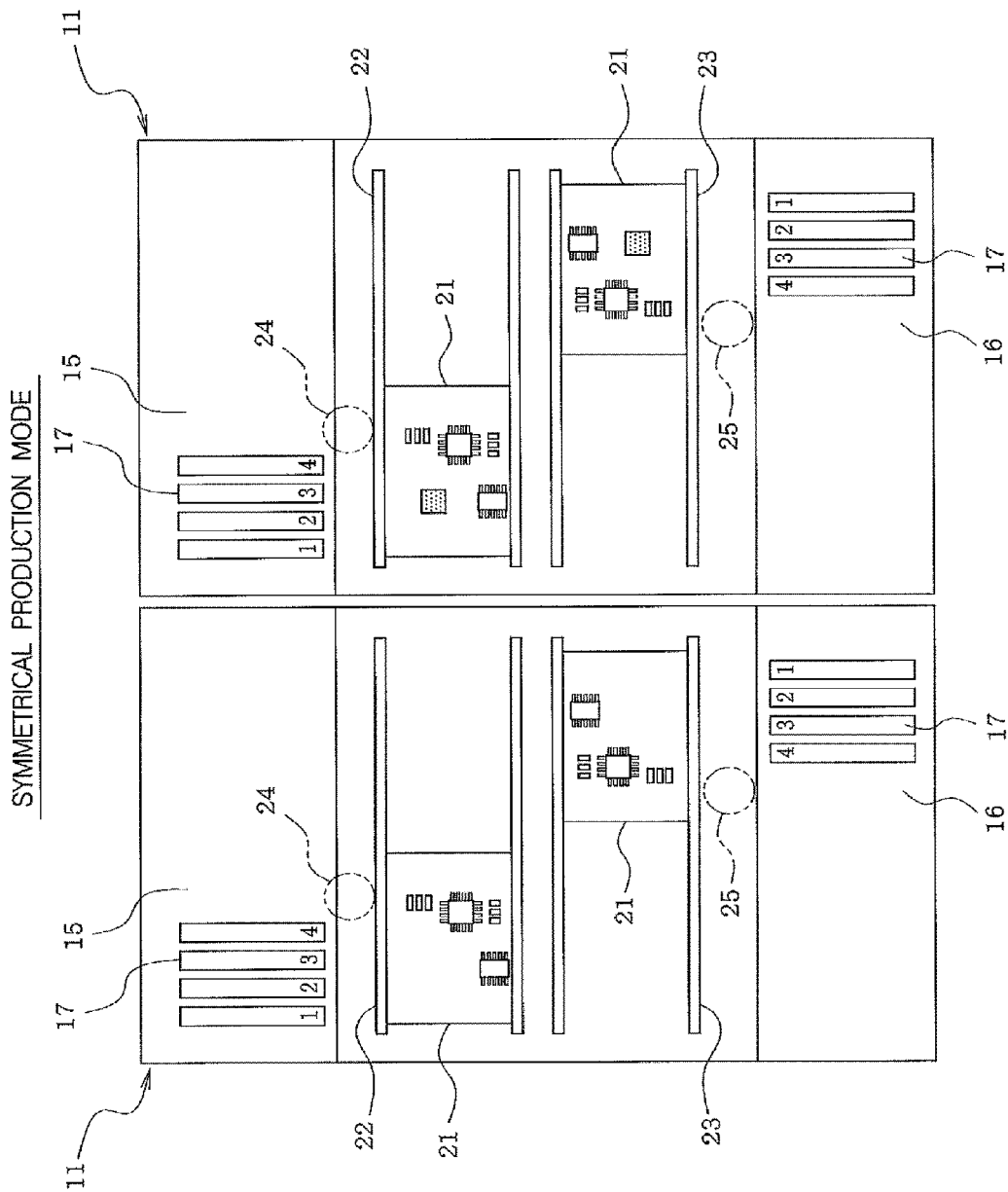

[Fig.4]

| PRODUCTION MODE | LANE PRODUCTION | CIRCUIT BOARD ROTATION ANGLE (°) | FIRST LANE PRODUCTION TIME (s) | SECOND LANE PRODUCTION TIME (s) |
|---|---|---|---|---|
| SYMMETRICAL PRODUCTION MODE | SYMMETRICAL PRODUCTION MODE | FIRST LANE 0 SECOND LANE 180 | 15 | 15 |
| SAME DIRECTION PRODUCTION MODE | BOTH LANES BALANCED MODE | 0 | 18 | 19 |
| LANE INDEPENDENT PRODUCTION MODE | FIRST LANE FASTEST MODE | 0 | 15 | 20 |
| | SECOND LANE FASTEST MODE | 0 | 21 | 17 |

[Fig.5]
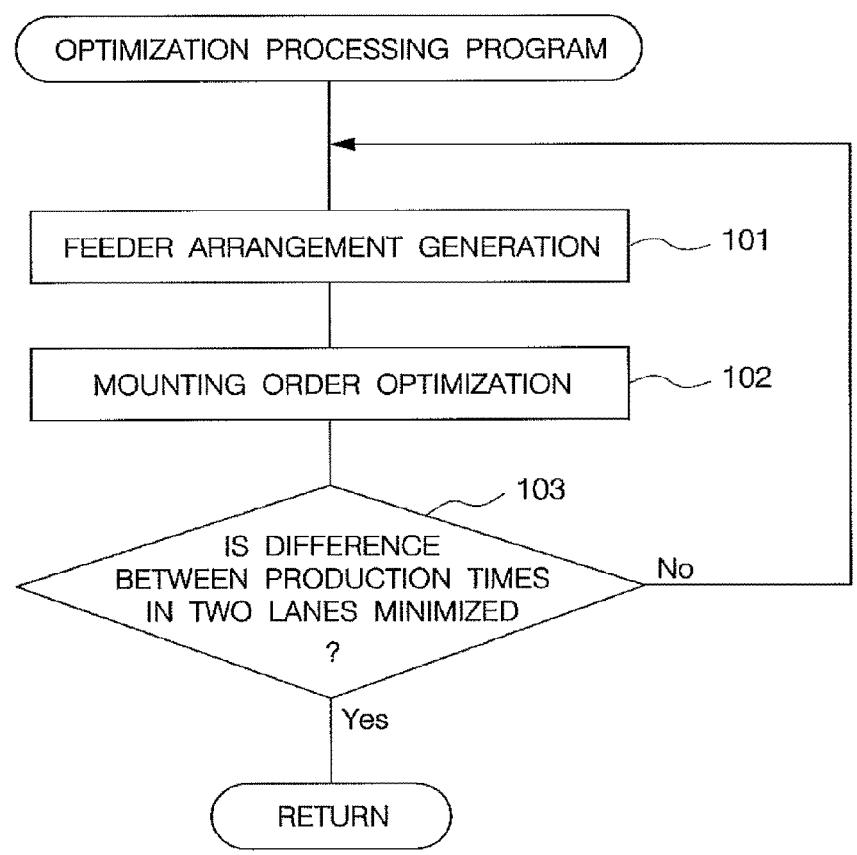

PRODUCTION MANAGEMENT SYSTEM FOR COMPONENT MOUNTING MACHINE

TECHNICAL FIELD

The present disclosure relates to a production management system for a component mounting machine with a two lane, two head system, which is provided with two lanes along which two circuit boards are conveyed in parallel, and in each lane a component is mounted on the circuit board using an individual mounting head.

BACKGROUND ART

In the related art, PTL 1 (JP-A-2012-99654) discloses providing two mounting heads and two lanes (conveyors) along which two circuit boards are conveyed in parallel in one component mounting machine, disposing two feeder set bases (component supply section) which interpose the two lanes at both sides of the component mounting machine, setting a plurality of feeders in each feeder set base, and mounting the component which is supplied by the feeders in each feeder set base to the circuit board of each lane by sucking using each mounting head.

CITATION LIST

Patent Literature

PTL 1: JP-A-2012-99654

BRIEF SUMMARY

Problem to be Solved

Here, since production time (required time for mounting components) for each lane becomes longer as the movement distances (movement times) of the mounting head between a component pickup position of the feeders and a component mounting position on the circuit board increases, arrangement of the feeders of the feeder set base and mounting order of the components which are mounted in a plurality of component mounting machines are optimized such that the movement distance (movement time) of the mounting head is minimized. However, in the component mounting machine which is provided with two lanes, in a case where component mounting boards are produced to the same specifications by circuit boards being conveyed in the same front/back direction in the two lanes, there is the following problem.

In order to simplify, and reduce human errors in production preparation (set-up work), it is desirable to dispose the feeders of the two lanes with the same arrangement, and to control production of the two lanes using one set of NC data. When preparing the NC data for each lane, it is easy for human error to occur during generation and management of the NC data. In a case where production of two lanes is controlled using one set of NC data, when optimizing the arrangement of the feeders and the mounting order of the components so as to minimize production time of one lane, the production time of the other lane becomes long and productivity is reduced. The reason being, when conveying the circuit boards in the two lanes in an orientation of the same front/back direction, the movement distances (movement times) of the mounting heads between the component pickup positions of the feeders and the component mounting positions on the circuit boards become different between both lanes without the arrangements of the component mounting positions on the circuit boards being the same viewed from the feeder side of each lane (the arrangement of the front and back is reversed viewed from the feeder side).

In order to avoid this, when conveying such that the orientation of the circuit boards between both lanes where front and back are reversed to each other, the arrangements of the component mounting positions on the circuit board viewed from the feeder side of each lane become the same (refer to FIG. 3), and the movement distances (movement times) of the mounting heads between both lanes become the same. However, there are cases where conveying such that the orientations of the circuit boards between both lanes of the component mounting machine are the same direction is necessary according to the type of device which is disposed at the upstream side (front process) and the downstream side (back process) of the component mounting machine. In this case, as described above, when optimizing the arrangement of the feeders and mounting order of the components so as to minimize production time of one lane of the two lanes, the production time of the other lane becomes long and productivity is reduced.

In addition, it is considered that a board inverting device is provided which conveys by inverting the orientation of the circuit board between the component mounting machine and the upstream side and downstream side devices of the component mounting machine. However, with this configuration there are cases where not only equipment costs increase, but an empty space to install the board inverting device becomes necessary, and installation of the board inverting device is difficult in terms of a space.

Therefore, the problem which the present disclosure solves is providing a production management system for a component mounting machine with a two lane, two head system, which is able to improve productivity without using a board inverting device.

Means for Solving the Problem

In order to solve the above problem, according to the present disclosure, there is provided a production management system for a component mounting machine, which is provided with two mounting heads and two lanes which convey two circuit boards in parallel, two feeder set bases disposed so as to interpose the two lanes, and a plurality of feeders set in each feeder set base, and which mounts components that are supplied from the feeders of each feeder set base being sucked by each mounting head on the circuit board of each lane. In a same direction production mode in which component mounting boards are produced to the same specifications by the circuit boards being conveyed in the same front/back direction in the two lanes, the component mounting machine is configured to be able to produce the component mounting boards to the same specifications in the two lanes using one set of NC data, by arranging the feeders of the two feeder set bases in the same manner, and setting the mounting order of the components on the circuit boards in the two lanes to be the same. The production management system for a component mounting machine includes an adjustment device which adjusts the arrangement of the feeders and mounting order of the components such that a difference between production times of the two lanes in the same direction production mode (both lanes balanced mode) is a predetermined value or lower. With this configuration, it is possible to operate two lanes with good balance and it is possible to improve productivity without using a board inverting device since the arrangement of the feeders and the mounting order of the components are adjusted so as to minimize the difference in production times of the two lanes in the same direction production mode (both lanes balanced mode).

In this case, it is preferable to optimize the arrangement of the feeders and the mounting order of the components so as to minimize a difference between production times of the two lanes in the same direction production mode.

In addition, it is desirable that the component mounting machine is configured such that the components are mounted so as to stop the two circuit boards, which are conveyed in the two lanes, by shifting position front and back in a conveyance direction, and is configured such that the plurality of feeders which are set in the two feeder set bases are also set so as to shift position front and back in the conveyance direction to be aligned with circuit board stopping positions of the two lanes. Thereby, the two mounting heads are also moved by the position being shifted front and back in the conveyance direction, and it is possible to prevent the two mounting heads or the moving mechanisms thereof interfering.

In addition, in addition to the same direction production mode (both lanes balanced mode), a first lane fastest mode and a second lane fastest mode may be selectable as a production mode in which the component mounting boards are produced to the same specifications by conveying the circuit boards in an orientation of the same front/back direction in the two lanes, and the adjustment device may adjust the arrangement of the feeders and the mounting order of the components such that a production time of a first lane, which is one of the two lanes, is minimized in the first lane fastest mode, and may adjust the arrangement of the feeders and the mounting order of the components such that a production time of a second lane, which is the other of the two lanes, is minimized in the second lane fastest mode. Thereby, even in a case where the component mounting boards are produced to the same specifications by conveying the circuit boards in an orientation of the same front/back direction in the two lanes, the first lane fastest mode or the second lane fastest mode are selectable by a user, and it is possible to widen the selection of the production mode by the user.

BRIEF DESCRIPTION OF DRAWINGS

FIG. 1 is a view illustrating a production management system of a component mounting line in an embodiment of the present disclosure.

FIG. 2 is a planar view of a component mounting machine and a device on the upstream side thereof which describes a same direction production mode.

FIG. 3 is a planar view of a printing machine and the component mounting machine which describes a symmetrical production mode.

FIG. 4 is a view which describes an example of a type of production mode, an orientation of a circuit board of each lane, and a production time for each lane.

FIG. 5 is a flow chart illustrating a flow of processes of an optimization processing program.

DESCRIPTION OF EMBODIMENTS

An embodiment specifying an aspect of the present disclosure will be described below. First, the configuration of a component mounting line 10 will be descried based on FIG. 1.

The component mounting line 10 aligns a plurality of component mounting machines 11 which mount an electronic component on a circuit board and a related machine (device other than the component mounting machine) which performs work related to component mounting. Here, the related machine is, for example, a solder printing machine 12, an appearance inspection device 13, a reflow device 14, an adhesive application device, and the like. The appearance inspection device 13 captures a mounting state or the like of the electronic component on the circuit board using a camera (not shown in the drawings), and carries out appearance inspection processing on the captured image. In a case where a defective board is detected by the appearance inspection device 13, the defective board is discharged by a defective board carry-out conveyor (not shown in the drawings) which is provided on an outlet side of the appearance inspection device 13.

A plurality of feeders 17, which respectively supply the electronic components, are set in feeder set bases 15 and 16 of each component mounting machine 11. In the present embodiment, as shown in FIG. 1, production is possible where the feeder set bases 15 and 16 and the plurality of feeders 17 are disposed on both sides of all of the component mounting machines 11 of the component mounting line 10 in a same direction production mode (both lanes balanced mode) which will be described later using all of the component mounting machines 11. However, it is sufficient if in a portion of the component mounting machines 11 the feeder set base 15 (or 16) and the plurality of feeders 17 are disposed only on one side. That is, it is sufficient if the feeder set bases 15 and 16 and the plurality of feeders 17 are disposed on both sides of the component mounting machines 11 producing in the same direction production mode.

As shown in FIG. 2 and FIG. 3, in each component mounting machine 11, two mounting heads 24 and 25 and two lanes 22 and 23 (conveyors) which convey two circuit boards 21 in parallel are mounted, the two feeder set bases 15 and 16 which interpose the two lanes 22 and 23 are disposed, and the plurality of feeders 17 are respectively set in each feeder set base 15 and 16. Thereby, the components which are supplied from the feeders 17 of each feeder set base 15 and 16 are respectively sucked by each mounting head 24 and 25 and mounted in the circuit board 21 of each lane 22 and 23. In each mounting head 24 and 25, a mark camera (not shown in the drawings) is mounted, which captures a fiducial mark or the like of the circuit board 21 of each lane 22 and 23, and a parts camera (not shown in the drawings), which captures components which are sucked to a suction nozzle (not shown in the drawings) of each mounting head 24 and 25, is provided in each lane 22 and 23.

Furthermore, in the present embodiment, as shown in FIG. 2 and FIG. 3, each component mounting machine 11 is configured such that a component is mounted so as to stop the two circuit boards 21, which are conveyed in the two lanes 22 and 23, by shifting position front and back in the conveyance direction. The plurality of feeders 17, which are set in the two feeder set bases 15 and 16, are also set so as to shift position front and back in the conveyance direction to be aligned with circuit board stopping positions of the two lanes 22 and 23.

The production of each device 11 to 14 of the component mounting line 10 is managed by a production management computer 27. In the production management computer 27, a display device 28 which displays various information on the production mode and the like of each device 11 to 14, and an input device 29, such as a keyboard, a mouse, or a touch panel, are connected.

As shown in FIG. 4, the production modes which are selectable by the user of the component mounting machine 11 are a symmetrical production mode, the same direction production mode (both lanes balanced mode), and a lane independent production mode (first lane fastest mode, or second lane fastest mode), and production of the component mounting board is executed by selecting one production mode from these. Whatever the production mode is, production of the two lanes 22 and 23 is controlled using one set of NC data by disposing the feeders 17 of the two lanes 22 and 23 of each component mounting machine 11 with the same arrangement in order to simplify, and reduce human errors in production preparation (set-up work) of each component mounting machine 11.

As shown in FIG. 3, in the symmetrical production mode, the component mounting boards are produced to the same specifications by the circuit boards 21 being conveyed with an orientation reverse to one another in the front/back direction in the two lanes 22 and 23 (a state in which the circuit board 21 of one lane is rotated 180°). Since the feeders 17 of the two lanes 22 and 23 are disposed at the same positions, in the symmetrical production mode, the arrangements of the component mounting positions of the circuit boards 21 are the same viewed from the feeders 17 side of each of the lanes 22 and 23, and the movement distances (movement times) of the mounting heads 24 and 25 between the component pickup positions of the feeders 17 and the component mounting positions on the circuit boards 21 are the same between both lanes 22 and 23. Thereby, in the symmetrical production mode, the production times of the two lanes 22 and 23 are the same.

Meanwhile, as shown in FIG. 2, in the same direction production mode (both lanes balanced mode), the component mounting boards are produced to the same specifications by the circuit boards 21 being conveyed in the same orientation of the front/back direction in the two lanes 22 and 23. In this manner, when conveying the circuit boards 21 in the orientation of the same front/back direction in the two lanes 22 and 23, the movement distances (movement times) of the mounting heads 24 and 25 between the component pickup positions of the feeders 17 and the component mounting positions on the circuit boards 21 become different between both lanes 22 and 23 without the arrangement of the component mounting positions on the circuit boards 21 being the same viewed from the feeders 17 side of each lane 22 and 23 (the arrangement of the front and back is reversed viewed from the feeders 17 side). For this reason, when optimizing the arrangement of the feeders 17 and mounting order of the components which are mounted using each component mounting machine 11 so as to minimize the production time of one lane, the production time of the other lane becomes long and productivity is reduced.

Therefore, in the same direction production mode (both lanes balanced mode), NC data is generated in the same direction production mode (both lanes balanced mode) and production of the two lanes 22 and 23 is controlled by the NC data, by optimizing the arrangement of the feeders 17 and the mounting order of the components such that the difference between production times of the two lanes 22 and 23 is made a predetermined value or lower, or preferably minimized by an optimization processing program of FIG. 5 which will be described later.

The process for optimizing the arrangement of the feeders 17 and the mounting order of the components is executed as follows according to the optimization processing program in FIG. 5 using the production management computer 27 (adjustment device). First, in step 101, after the feeder arrangement of each component mounting machine 11 of the component mounting line 10 is generated, the process advances to step 102, and the mounting order of the components is optimized such that all of the specified components can be mounted on the circuit board 21 efficiently. After this, the process advances to step 103, where it is determined whether the difference between the production times of the two lanes 22 and 23 is minimized. If the difference is determined not to be minimized, the process returns to step 101, and the process in which the mounting order of the components is optimized by regenerating the feeder arrangement is repeated (step 102). Thereby, in step 103, at a point in time when the difference of production times between the two lanes 22 and 23 is determined to be minimized, the program is complete.

Meanwhile, in the lane independent production mode (first lane fastest mode or second lane fastest mode), in the same manner as the same direction production mode, the component mounting board is produced to the same specifications by conveying the circuit boards 21 in an orientation of the same front/back direction in the two lanes 22 and 23. However, in the first lane fastest mode, the arrangement of the feeders 17 and the mounting order of the components are adjusted such that the production time of the first lane 22 is minimized, and in the second lane fastest mode, the arrangement of the feeders 17 and the mounting order of the components are adjusted such that the production time of the second lane 23 is minimized.

According to the present embodiment which is described above, it is possible to operate the two lanes 22 and 23 with good balance, and it is possible to improve productivity without using a board inverting device since the arrangement of the feeders 17 and the mounting order of the components are adjusted so as to minimize the difference in production times of the two lanes 22 and 23 in the same direction production mode (both lanes balanced mode). Moreover, by arranging the feeders 17 of the two feeder set bases 15 and 16 in the same manner, and setting the mounting order of the components of the circuit boards 21 of the two lanes 22 and 23 to be the same, it is possible to simplify, and reduce human errors in production preparation (set-up work) since it is possible to produce component mounting boards to the same specifications in the two lanes 22 and 23 using one set of NC data.

Furthermore, in the present embodiment, as shown in FIG. 2 and FIG. 3, since the components are mounted so as to stop the two circuit boards 21, which are conveyed in the two lanes 22 and 23 of each component mounting machine 11, by shifting position front and back in the conveyance direction, and the plurality of feeders 17 which are set in the two feeder set bases 15 and 16 are also set so as to shift position front and back in the conveyance direction to be aligned with the circuit board stopping positions of the two lanes 22 and 23, the two mounting heads 24 and 25 are also moved such that the positions are shifted front and back in the conveyance direction. Thus, it is possible to prevent the two mounting heads 24 and 25 or the moving mechanisms thereof interfering. However, the present disclosure may be configured such that the circuit board stopping positions of the two lanes 22 and 23 are not shifted front and back in the conveyance direction (in a case where the two mounting heads 24 and 25 or the like do not interfere).

Here, in the present embodiment, as the production modes which are selectable by the user and the symmetrical production mode and the lane independent production mode (first lane fastest mode, or second lane fastest mode) are set in addition to the same direction production mode (both lanes balanced mode), it is advantageous that it is possible to widen the selection of the production mode by the user. However, the configuration may omit both or any one of the symmetrical production mode and the lane independent production mode (first lane fastest mode, or second lane fastest mode).

In addition, it goes without saying that the configuration of the component mounting line 10 and the like in the present disclosure may be appropriately modified, and implementation is possible by making various modifications within a range which does not deviate from the gist of the present disclosure.

REFERENCE SIGNS LIST

10 . . . COMPONENT MOUNTING LINE, 11 . . . COMPONENT MOUNTING MACHINE, 12 . . . SOLDER PRINTING MACHINE, 13 . . . APPEARANCE INSPECTION DEVICE, 14 . . . REFLOW DEVICE, 15, 16 . . . FEEDER SET BASE, 17 . . . FEEDER, 21 . . . CIRCUIT BOARD, 22, 23 . . . LANE, 24, 25 . . . MOUNTING HEAD, 27 . . . PRODUCTION MANAGEMENT COMPUTER 27 (ADJUSTMENT DEVICE)

The invention claimed is:

1. A production management system for a component mounting machine, comprising:
two mounting heads and two lanes which convey two circuit boards in parallel;
two feeder set bases disposed so as to interpose the two lanes; and
a plurality of feeders set in each feeder set base, and which mounts, on the circuit board of each lane, components that are supplied from the feeders of each feeder set base being sucked by each mounting head,
wherein in a same direction production mode in which component mounting boards are produced to the same specifications by the circuit boards being conveyed in the same front/back direction in the two lanes, the component mounting machine is configured to be able to produce the component mounting boards to the same specifications using one set of NC data, by arranging the feeders of the two feeder set bases in the same manner, and setting the mounting order of the components on the circuit boards in the two lanes to be the same, and
wherein the production management system for a component mounting machine includes: an adjustment device which adjusts the arrangement of the feeders and the mounting order of the components such that a difference between production times of the two lanes in the same direction production mode is a predetermined value or lower.

2. The production management system for a component mounting machine according to claim 1, wherein the adjustment device optimizes the arrangement of the feeders and the mounting order of the components so as to minimize the difference between the production times of the two lanes in the same direction production mode.

3. The production management system for a component mounting machine according to claim 1, wherein the component mounting machine is configured such that the components are mounted so as to stop the two circuit boards, which are conveyed in the two lanes, by shifting position front and back in a conveyance direction, and is configured such that the plurality of feeders which are set in the two feeder set bases are also set so as to shift position front and back in the conveyance direction to be aligned with circuit board stopping positions of the two lanes.

4. The production management system for a component mounting machine according to claim 1, wherein in addition to the same direction production mode, a first lane fastest mode and a second lane fastest mode are selectable as a production mode in which the component mounting boards are produced to the same specifications by conveying the circuit boards in an orientation of the same front/back direction in the two lanes, and
wherein the adjustment device adjusts the arrangement of the feeders and the mounting order of the components such that a production time of a first lane, which is one of the two lanes, is minimized in the first lane fastest mode, and adjusts the arrangement of the feeders and the mounting order of the components such that a production time of a second lane, which is the other of the two lanes, is minimized in the second lane fastest mode.

* * * * *